United States Patent
Grunwald

(10) Patent No.: US 7,247,557 B2
(45) Date of Patent: Jul. 24, 2007

(54) METHOD AND COMPOSITION TO MINIMIZE DISHING

(75) Inventor: John Grunwald, Ramat-Gan (IL)

(73) Assignee: J.G. Systems, Inc., Miami, FL (US)

( * ) Notice: Subject to any disclaimer, the term of this patent is extended or adjusted under 35 U.S.C. 154(b) by 221 days.

(21) Appl. No.: 10/867,407

(22) Filed: Jun. 14, 2004

(65) Prior Publication Data

US 2005/0250333 A1    Nov. 10, 2005

(30) Foreign Application Priority Data

May 4, 2004    (IL)    ...................... 161771

(51) Int. Cl.
*H01L 21/302*    (2006.01)
*H01L 21/4763*    (2006.01)

(52) U.S. Cl. ................... 438/633; 438/692; 438/693

(58) Field of Classification Search ............... 438/691, 438/692, 693, 631, 633; 51/509, 309
See application file for complete search history.

(56) References Cited

U.S. PATENT DOCUMENTS

| | | | |
|---|---|---|---|
| 6,004,880 A * | 12/1999 | Liu et al. .................... 438/692 |
| 6,066,030 A * | 5/2000 | Uzoh .......................... 451/41 |
| 6,149,830 A | 11/2000 | Lin et al. |
| 6,264,536 B1 * | 7/2001 | Crevasse et al. ............. 451/41 |
| 6,413,403 B1 * | 7/2002 | Lindquist et al. ............ 205/97 |
| 6,522,010 B2 * | 2/2003 | McTeer ...................... 257/765 |
| 6,537,144 B1 | 3/2003 | Tsai et al. |
| 6,722,950 B1 * | 4/2004 | Dabral et al. ................. 451/36 |
| 6,797,623 B2 * | 9/2004 | Sato et al. ................... 438/691 |
| 7,098,133 B2 * | 8/2006 | Kim ........................... 438/687 |
| 2001/0024878 A1 * | 9/2001 | Nakamura .................. 438/691 |
| 2001/0036746 A1 * | 11/2001 | Sato et al. ................... 438/745 |
| 2003/0015435 A1 * | 1/2003 | Volodarsky et al. ......... 205/640 |
| 2003/0183530 A1 * | 10/2003 | Chou et al. ................. 205/157 |
| 2003/0194953 A1 * | 10/2003 | McClain et al. .............. 451/41 |
| 2004/0009659 A1 * | 1/2004 | Kim ........................... 438/633 |
| 2004/0009668 A1 | 1/2004 | Catabay et al. |
| 2004/0182720 A1 * | 9/2004 | Sato et al. ................... 205/641 |
| 2004/0235297 A1 * | 11/2004 | Lin ............................ 438/687 |
| 2005/0016960 A1 * | 1/2005 | Nogami et al. ............... 216/83 |
| 2005/0082165 A1 * | 4/2005 | Sato et al. ............... 204/230.2 |
| 2005/0173260 A1 * | 8/2005 | Basol et al. ................. 205/662 |
| 2006/0009033 A1 * | 1/2006 | Basol et al. ................. 438/674 |
| 2006/0030156 A1 * | 2/2006 | Butterfield et al. ......... 438/691 |
| 2006/0117667 A1 * | 6/2006 | Siddiqui et al. .............. 51/309 |
| 2006/0118425 A1 * | 6/2006 | Basol et al. ................. 205/125 |

* cited by examiner

*Primary Examiner*—M. Wilczewski
(74) *Attorney, Agent, or Firm*—Carmody & Torrance LLP

(57) ABSTRACT

Processes are disclosed for producing electronic interconnect devices, particularly semi-conductor wafers, with metal interconnect traces thereon wherein the surface of said device has improved planarity. Said planarity is achieved initially through the use of pulse reverse electrolytic plating techniques. Planarity is further enhanced by cathodically protecting the metal interconnect traces during the polishing operation. Cathodic protection is achieved by overtly applying a cathodic charge to said traces and/or by contacting said traces, during polishing, with a metal that is capable of sacrificial corrosion when in contact with the metal of the interconnect traces.

13 Claims, No Drawings

… …

METHOD AND COMPOSITION TO MINIMIZE DISHING

FIELD OF THE INVENTION

The invention relates to improved planarization of semiconductor wafers, and more particularly to chemical mechanical polishing in the course of damascene manufacturing processes.

BACKGROUND OF THE INVENTION

Copper interconnect devices are gaining rapid acceptance over aluminum interconnects, due to superior electrical conductivity of copper. Practicing what is known in the industry as damascene technology, one typically deals with interconnect trenches or vias that are filled with electroplated copper.

Ideally, copper electroplating would fill the trenches to be "level" with the patterned barrier layer underneath said copper "filling", or even more desirably, electroplated copper would fill said trenches only to the level of the surface of the dielectric. In actual industrial practice however, electroplated copper "overfills" and protrudes said trenches, resulting in a rough, "bumpy" surface topography, as opposed to one that is smooth or "planar". Thus, the pursuit of planarity has become a top priority in the fabrication of ULSI devices.

Chemical Mechanical Planarization (CMP) is currently the industry's premier choice to achieve planarization, as it serves to remove "excess", unwanted material that interferes with planarity.

CMP is perceived to be a complex process, involving both mechanical grinding or abrading, and also chemical etching/oxidation. The detailed, scientific mechanism of CMP is yet to be elucidated, especially as it relates to its chemical component. Hence, CMP still remains a very complex operation, relying principally on empirical, trial-and-error developments.

While great strides are being made to improve CMP processes (as reflected in the numerous patents which suggest approaches/solutions to given tasks), planarity problems associated with copper still remain perhaps the industry's greatest challenge, yet to be resolved satisfactorily.

The problem relating to planarity of copper conductors, is known in the trade as "dishing", which can be somewhat simplistically described as denoting the undesirable reduction of thickness of the metal line, causing an increase in electrical resistance and higher current density at a given voltage, than what the conductor has been designed for, resulting in functional deficiency of the interconnect device.

Even though the precise causes and mechanisms of dishing are poorly understood, as noted previously, there appears strong indication that dishing is caused both by mechanical gouging, scratching, overpolishing by the polishing media, as well as uncontrolled, indiscriminate chemical erosion of copper.

In embodying CMP processes and compositions, the prior art predominantly uses aqueous solutions or dispersions principally consisting of slurries of abrasive particles that comprise oxidizers, surfactants, viscosity modifiers, and the like. Abrasive particles are delivered to the wafer substrate via a porous polymer polishing pad, which polymer pad, embedded with the abrasive particles, is rotated against the wafer substrate to be planarized, where it removes unwanted, protruding matter. More recent developments disclose fixed abrasive pads that obviate the use of abrasive slurries, calling only for "cooling fluid" during CMP.

The inherent difficulty with above liquid systems, wherein water is essentially the principal, often sole, vehicle that carries the slurry to areas to be planarized, is that the distribution of abrasive particles in such aqueous, liquid media is non-uniform, resulting in uneven polishing, that aggravates dishing.

There is therefore a need in the industry for improved CMP compositions and methods that alleviate problems of planar non-uniformity, especially as they relate to dishing. There is also a need for an additional/alternate vehicle, other than aqueous suspensions that are prone to compositional non-uniformity, to deliver CMP ingredients/compositions to the wafer substrate.

PRIOR ART

The following patents are referenced herewith, as being partially reflective of the prior art and are each incorporated herein by reference in their entirety.

U.S. Pat. No. 6,149,830 to Lin proposes additions of organic/polymeric viscosity modifiers to the CMP slurry composition, in order to reduce severe dishing of "large" metal patterns. The patent proposes viscosities ranging widely from 3.4 to 12 cps., which may undesirably impact the bulk properties of the slurry.

U.S. patent Publication No. 20040009668 A1 to Schinella, discloses the use of a somewhat laborious, cumbersome combination of CMP, electropolishing, and dry etching, as a means to promote planarity of both barrier layers and metal patterns.

U.S. Pat. No. 6,537,144 B1 to Tsai, surmises that copper dishing is caused by an "electrochemical effect" taking place at the copper/barrier interface, resulting in "enhanced removal of copper in surface features and therefore causes higher dishing". To remedy above undesirable metal dissolution or removal, Tsai proposes embedding metal into the polishing pad, or adding metal to the slurry, in order to "maintain electrochemical equilibrium". It is not, however, quite clear what is meant by above "equilibrium", or how the practice of such "equilibrium" can help improve integrity of copper conductors.

BRIEF DESCRIPTION OF THE INVENTION

The invention discloses ways to improve planarization, especially as it relates to copper interconnects of ULSI devices. They are:

1. Cathodic protection of metal areas from unwanted erosion.
2. Anodic electrodissolution of overplated copper areas, said electrodissolution being done in the course of electroplating, using the same set-up (same plating cell, same bath) that is used for plating.
3. Generate, electrophoretically, a viscous layer at the interface of wafer/slurry, to slow down erosion during CMP.
4. Employ a paste as a carrier/vehicle to deliver CMP ingredients to the wafer undergoing CMP, replacing aqueous fluids of the prior art.

DETAILED DESCRIPTION OF THE INVENTION

It is an object of the invention to improve CMP planarization by imparting a negative electric potential to copper areas being polished, thereby minimizing the driving force for copper dissolution, as this driving force leads to indiscriminate/random chemical erosion of copper at the polishing pad/copper interface. Said negative potential can be imparted via connection of the area to be to be polished to a DC power supply. Alternatively, negative electrical charge can be imparted to metal areas that are to be protected from unwanted chemical erosion, by bringing said metal areas into physical contact (during/via CMP polishing) with a metal that will act anodically as it undergoes chemical attack (i.e. acts as "sacrificial anode"), transferring the electrons generated at the corroding areas, to the copper trenches or vias that it rubs against.

Instant patent thus envisions inhibiting localized undesirable erosion, by generating negative charges in the intimate vicinity of said copper areas, transferring said negative charges to the copper areas whose attack or dissolution needs to be minimized.

Embodying the "sacrificial anode" model of the patent can be accomplished, for example, via any one or more of the following methods:

1. Coating, plating, or enveloping the polishing pad with metal that corrodes sacrificially/anodically to copper, when said polishing pad is brought into contact with the copper areas to be protected from unwanted erosion during CMP operation. This approach is especially helpful for fixed abrasive pads, due to their superior flatness, that ensures intimate contact with the surface to be protected anodically;
2. Coating, at least partially, the metal oxide abrasives comprising the slurry, with corrodible metal that can act as localized sacrificial anodes in the slurry media when "rubbed" against copper conductors to be protected from unwanted erosion;
3. Apply as needed, a paste comprising corrodible metal powder, to the CMP pad, or to the wafer substrate undergoing CMP, or both. The corrodible powder in the paste then acts as sacrificial anode to the copper areas that are to be protected from unwanted erosion when exposed to the CMP polishing fluid; or
4. Electrically applying a negative charge to the copper areas to be polished during the polishing operation.

Another preferred object of the invention is to reduce dishing by generating a viscous "fluid" layer at the copper/slurry interface, designed to significantly slow down the mass transfer of copper ions from the polishing pad/copper interface, said reduced mass transfer resulting in greatly reduced rate of unwanted chemical dissolution or erosion of copper. The invention thus envisions generation of a "localized" viscous layer at the corroding copper interface, where it is needed most, to slow down mass transfer and impede the outflow of copper ions, and inflow of corrosion promoting oxidants, that are present in the slurry fluid, and contribute to chemical erosion. This embodiment of localized, interfacial viscous layer, is greatly preferred over "bulk" additions of viscosity enhancing polymeric additives of the prior art.

A yet further object of the invention contemplates enhancing planarity by reducing/minimizing copper "overplate" during electroplating of trenches and vias. This is achieved by periodically and alternatingly reversing polarity of the plated areas, i.e., trenches or vias, in the course of the electroplating step, and in the copper electroplating bath itself, causing periodic anodic dissolution of high current density areas. Indeed, high current density areas are usually the ones affected by overplating, and are also the ones that require CMP overpolishing, said overpolishing often conducive to depressions/dishing in copper conductors.

A still further embodiment of the patent envisions applying, supplying a paste to the CMP polishing pad, or to the substrate undergoing polishing, or both, said paste potentially serving as auxiliary polishing media, or in some cases replacing the media, itself. The patent thus offers an alternative vehicle, other than aqueous suspensions, for delivering CMP polishing media to the substrate surface. Above pastes can comprise a variety of chemical compounds designed to achieve a given task or function. Specifically, pastes can comprise particulate abrasive metal oxides, metal powders, metal corrosion inhibitors, cleaning compounds/detergents, etc. designed for a given, specific CMP need.

Embodying CMP pastes will contribute to a wider CMP process window and enhanced CMP flexibility, where one can design a variety of tailor-made pastes to address specific CMP needs. Also, above embodiment will potentially be of special interest in the case of fixed abrasive pads, offering additional functionality to the pad, some of which cannot be built into said pad. The paste is thus acting, in a way, as an extension of the pad, and or the liquid fluid used in conjunction with said fixed abrasive pads. Again, the CMP paste of instant invention, is deliverable to the surface of the substrate being polished, by supplying, spreading it onto said substrate, thus forming a solid substrate/paste composite The solid substrate in the construction of such composite can be a polymeric material in the form of a cloth, a textile fabric, paper and the like. One can envision that above paste/solid composites can at times be embodied as disposable, "one shot", low cost polishing pads in themselves.

In another preferred embodiment, one visualizes attaching to the polishing pad a thin, perhaps sponge-like, porous "cloth" imbued (possibly at elevated temperatures to facilitate saturation/cloth-penetration)with the desired paste composition. The construction of such "cloth" can be from polymeric material, textile fabric, paper, and the like.

In addressing the anodic dissolution of metal, particularly copper in the electrolytic plating bath itself, for the purpose of minimizing the need for undesirably aggressive CMP abrasion, the patent envisions programmed (possibly via computer) anodic action in the course of electroplating, or "batch type"/as needed anodic action, dictated by the level/extent of overplating. Alternatively, anodic action can be embodied at the completion of electroplating and before the start of CMP abrasion.

In a still further preferred embodiment, anodic etching or dissolution will be effected both intermittently in the course of electroplating, but if needed, also at the end of the electroplating operation. Specifically, the patent contemplates periodically/intermittently interrupting electroplating, reversing electric potential to cause electrodissolution, then again resume electroplating, and so on.

Above preferred embodiment of electropolishing or electroetching copper in the course of electroplating, and using the very same electroplating apparatus and electrolyte that is used for plating trenches and vias, offers enhanced/simplified planarization prospects, as opposed to prior art electropolishing that call for special electropolishing baths and apparatus.

Also, while the above plating/polishing embodiment is visualized as being enacted in conjunction with CMP, it is anticipated that in some cases CMP can be significantly minimized, or possibly omitted.

In embodying automatic, possibly computer commanded anodic copper removal, the patent envisions instrumental input via, for example, a laser signal from overplated areas, said signal in essence mapping, controlling/directing optimal anodic current density as needed, and where needed, to dissolve away overplated metal protrusions/bumps.

It is noted that above embodiment of "in-situ" (meaning in the course/progress of electroplating) anodic dissolution is not limited to a given plating bath. Thus, while copper sulphate based electroplating baths are currently favored, a possibly preferred embodiment contemplates pyrophosphate plating compositions, in light of their often superior throwing power.

The embodiment of the patent that contemplates "generation" of a viscous fluid at the interface of the wafer substrate for the purpose of slowing/hindering copper ion outflow from the wafer/slurry interface and thereby minimizing unwanted copper corrosion, the patent envisions electrophoresis embodiments practiced, for example, in the area of corrosion protection of metals, where one skilled in the art can find a variety of organic, polymeric compounds at his disposal, that can be embodied electrophoretically. They can be of the anodic or preferably the cathodic type.

A preferred embodiment of the patent contemplates use of pastes in the course of CMP, or for cleaning the ULSI wafer after completion of CMP.

In the context of this patent, paste is defined as a composition that is of "smearable" consistency or firmness, at room temperature. It can thus be applied to (smeared/spread onto) either the CMP pad, to the substrate that is to undergo or is undergoing CMP polishing, or can spread onto both the CMP pad and onto the wafer substrate.

Conceptually, and for the purpose of aiding those skilled in the art in maximizing the many potential advantages afforded by pastes in CMP applications, instant patent envisions pastes potentially analogous to the ones used in silk screening, conductive pastes, printing, electronics, imaging, dentifrice, and the like.

Indeed, tooth pastes can be designed to provide varying degrees of abrading action, without causing scratching. This is not unlike what is needed foe ULSI copper conductors, where CMP scratching can be an overwhelming problem.

In formulating/designing paste compositions for CMP applications, the following are helpful, though not limiting considerations:
1. The paste should preferably be water soluble or water dispersible over a broad pH range, in order to facilitate its removal from the wafers after the paste has accomplished the desired task. Thus, the bulk ingredients composing the body of the paste will be selected from polymeric compounds such as polythelyne/polypropylene glycols, gelatin, organic colloids, carbowaxes, glycerols, polymeric surfactants, emulsifiers, and the like.
2. The paste should preferably be a solid at about 20 DEG.C, and easily spreadable/dispensable/smearable, coatable onto a broad range of substrates.
3. The paste should afford inclusion of solid particles, such as for example, metal oxide abrasive particles, metal oxidants, particle of metal powder, and the like.
4. The paste should have long shelf life, preferably at least one year. This is of additional importance where pastes will be embodied via solid sheets.

Finally, additional benefits and embodiments afforded by CMP pastes are listed below:
1. They can serve as a vehicle to enhance or reduce a given CMP action, such as more aggressive or less aggressive abrasion, additional or lower metal inhibition, etc. One thus envisions CMP pastes that comprise varying abrasive particle content, from zero to saturation, as needed for a given abrading action.
2. They can be embodied using "cloths" saturated with a desired paste, bringing said cloths into contact with the substrate to be polished, for example via the CMP pad.

The term "cloth" in instant patent denotes broadly a solid sheet-like construction that serves to deliver the paste to the needed surface.
3. Cleaning the wafer using a cleaning paste, possibly with no abrasives in it, after completion of CMP. Indeed, wafer surface cleanliness after CMP is a major problem, due to particulate residue contamination, that tenaciously adheres to the wafer and is difficult to remove.

I claim:

1. A process for improving the planarity of metal interconnect traces on a non-conductive or semiconductor surface, said process comprising:
   a. cathodically protecting said traces while polishing the traces to improve planarity, wherein the polishing comprises contacting the surface with a polishing pad and a polishing paste and then moving said pad in relation to said surface or said surface in relation to said pad, wherein the polishing paste is a solid at about 20° C.

2. A process according to claim 1 wherein said cathodic protection comprises one or more procedures selected from the group consisting of:
   i. coating a polishing pad, used in polishing the traces, with a metal which is capable of corroding sacrificially or anodically when brought into contact with the metal traces;
   ii. coating abrasive particles, used in the slurry or paste for polishing traces, with a metal which is capable of corroding sacrificially or anodically when brought into contact with the metal traces; and
   iii. electrically applying a negative charge to the metal traces during polishing.

3. A process according to claim 2 wherein the metal traces comprise copper.

4. A process according to claim 2 wherein the surface comprises a semi-conductor wafer.

5. A process according to claim 4 wherein the metal traces comprise copper.

6. A process according to claim 1 wherein the metal traces comprise copper.

7. A process according to claim 1 wherein the surface comprises a semi-conductor wafer.

8. A process for improving the planarity of metal interconnect traces on a non-conductive or semi-conductor surface, said process comprising cathodically protecting said traces while polishing the traces to improve planarity by using one or more procedures selected from the group consisting of:
   i. coating a polishing pad, used in polishing the traces, with a metal which is capable of corroding sacrificially or anodically when brought into contact with the metal traces; and
   ii. electrically applying a negative charge to the metal traces during polishing, wherein the polishing comprises contacting the surface with a polishing pad and a polishing paste and then moving said pad in relation to said surface or said surface in relation to said pad wherein the polishing paste is a solid at about 20° C.

9. A process according to claim 8 wherein the metal traces comprise copper.

10. A process according to claim 9 wherein the metal traces comprise copper.

11. A process according to claim 8 wherein the surface comprises a semi-conductor wafer.

12. A process according to claim 9 wherein the surface comprises a semi-conductor wafer.

13. A process according to claim 12 wherein the metal traces comprise copper.

* * * * *